United States Patent [19]
Poncot et al.

[11] Patent Number: 5,361,159
[45] Date of Patent: Nov. 1, 1994

[54] ANGULAR ACOUSTO-OPTICAL DEFLECTION DEVICE AND SPECTRUM ANALYZER USING SUCH A DEVICE

[75] Inventors: Jean-Claude Poncot, Valbonne; Carlo Rosolen, Vauhallan, both of France

[73] Assignee: Thomson-CSF, Puteaux, France

[21] Appl. No.: 22,915

[22] Filed: Feb. 26, 1993

[30] Foreign Application Priority Data

Feb. 28, 1992 [FR] France ................ 92 02363

[51] Int. Cl.$^5$ .................................... G02F 1/34
[52] U.S. Cl. ........................... 359/305; 359/285; 359/287; 359/313
[58] Field of Search .............. 359/285, 287, 305, 313, 359/314

[56] References Cited

U.S. PATENT DOCUMENTS

| 3,944,334 | 3/1976 | Yano et al. ............. | 359/313 |
|---|---|---|---|
| 4,037,933 | 7/1977 | Yano et al. . | |
| 4,040,722 | 8/1977 | Nielsen ................ | 359/313 |
| 4,232,952 | 11/1980 | Barta et al. .......... | 359/313 |
| 4,257,685 | 3/1981 | Barta et al. .......... | 359/313 |
| 4,659,184 | 4/1987 | Sohn et al. . | |

FOREIGN PATENT DOCUMENTS

| 0180449 | 5/1986 | European Pat. Off. . | |
|---|---|---|---|
| 2127372 | 10/1972 | France . | |
| 53-13934 | 2/1978 | Japan ................ | 359/313 |

Primary Examiner—Eugene R. LaRoche
Assistant Examiner—Tan Nguyen
Attorney, Agent, or Firm—Oblon, Spivak, McClelland, Maier & Neustadt

[57] ABSTRACT

Devices for deflecting an optical beam under the action of an ultrasonic beam propagating in a block of active acousto-optical material and operating under Bragg tangential conditions, with the acousto-optical interaction being anisotropic. The devices also include entry and exit faces into this material blocks which are inclined at angles $\alpha$ and $\beta$ such that the incoming beam and the emerging beam after the interaction are significantly parallel, keeping operation under Bragg tangential conditions. The devices can also be used to make a spectrum analyzer with a very large number of points and very high dynamics.

10 Claims, 4 Drawing Sheets

ANGULAR ACOUSTO-OPTICAL DEFLECTION DEVICE AND SPECTRUM ANALYZER USING SUCH A DEVICE

BACKGROUND OF THE INVENTION

1. Field of the Invention

This invention concerns devices used to deflect an optical beam through an angle using an acoustic beam. It also concerns spectrum analyzers in which this type of device analyzes the electrical signal spectrum used to obtain ultrasounds which interact with the light beam to modify its frequency.

2. Discussion of the Related Art

FIG. 1 shows a known type of such a device, normally called a Bragg cell, which includes a crystal with anisotropic elasto-optical properties cut out in the shape of a rectangular parallelepiped 101.

Based on this crystal, an electro-acoustic transducer 102 is excited by an electrical signal at frequency $F_O$. The ultrasonic signal thus generated forms a beam which propagates in the crystal to form a stationary waves system 103, schematically shown on the figure by a series of lines. The optical properties of the crystal are modified at the peaks and nodes of these stationary waves by the elasto-optical properties of the material used.

An incident light beam I with optical aperture W designed to interact with acoustic waves, arrives on one of the large faces of part 101 at an angle $\Theta_i$. Under the refraction effect at its entry into block 101, it intercepts the acoustic beam 103 at angle $\Theta_B$, called the Bragg's angle. The incident beam divides into two parts under the effect of the interaction between the light waves and the ultrasonic waves, one part $I_0$ which is not affected by this interaction and which finally crosses the cell as it would cross a slide with parallel faces, and the other part $I_1$ which is affected by the interaction and which leaves the ultrasonic beam at an angle $\epsilon$ very slightly inclined relative to the normal to this beam and therefore, in this previously known technique, relative to the cell entry and exit faces. This beam $I_1$ leaves the cell at an angle Hd itself low with respect to the normal to these faces of the cell, simply by the application of the laws of refraction.

The light wave of beam $I_1$ affected by the acousto-optical infraction has a frequency different from the frequency of the incident beam I, whereas the beam $I_0$ has the same frequency as the incident beam I. This beam $I_0$ is therefore useless and corresponds to a parasite fraction which should be minimized as much as possible, although can never be completely eliminated.

To prevent the beam $I_0$ from reflecting diffracting on the lower side of the cell as it leaves the interaction area, thus forming parasite light which could disturb the measurements made on the beam $I_1$, arrangements are made so that the lower limit of the incident beam I strikes the cell at a distance d from its lower face such that the lower part of the beam $I_0$ does not strike this lower face and that the entire beam $I_0$ leaves through the cell exit face (through which $I_1$ normally leaves).

The orientation of the crystal from which block 101 is carved, and the angle of incidence $\Theta_i$, are selected, by a known method, so that this cubicle works in a mode called "Bragg tangential", for which there are two frequencies $f_0$, one low and one high, for which the tolerance on the device phase match is maximum. This makes it possible to use the device on a relatively wide band around these frequencies $f_0$. In known practice, this corresponds to an anisotropic type acousto-optical interaction taking advantage of the optical diffraction fringes of some crystals such as Li Nb $O_3$, with so-called tangential "Bragg" type phase match, allowing two possible frequency choices for the same acoustic direction.

The set of parameters corresponding to these operating conditions is such that the output angle $\epsilon$ (and therefore $\Theta_d$) is low, as described above.

The band width thus available on the frequency $f_0$ makes it possible to use this type of device to analyze the spectrum of an electrical signal with a relatively wide bandwidth around $f_0$. A diagram of this type of analyzer is shown in FIG. 2.

A coherent and parallel light emitter 204, for example a laser diode, emits the beam I with optical width W which is applied to cell 101. The electrical signal to be analyzed, with central frequency $f_0$ is applied to the transducer 102 for this cell and, as described above, an output beam $I_1$ results, affected by the acousto-optical interaction.

The frequency of this beam $I_1$ depends on the frequency $f_0$, but in fact this is not the phenomenon that is used here. In fact, as described above, the output angle $\Theta_d$ of beam $I_1$ is low, but it also depends on the frequency $f_0$; this is the effect that is used as described below.

This beam $I_1$ is applied to a convergent lens 205 which focuses on a multiple detector 206 formed from a network of elementary photoelectric cells which have distinct outputs.

Under these conditions, for each distinct frequency included in the complex signal applied to transducer 102, a distinct luminous spot is obtained on one of the cells in the network 206. This luminous spot also has an intensity approximately proportional to the intensity of the spectral beam corresponding to the distinct frequency. We thus obtain an electrical signal on each of the electrical outputs of analyzer 206, the amplitude of which corresponds to the corresponding spectral line contained in the signal to be analyzed.

In order to eliminate the optical signal $I_0$ not affected by the interaction, an absorbent screen 207 is used which intercepts the signal so that there is no risk of it reflecting arbitrarily and disturbing the measurements.

However, the optical width W of the incident beam I, used as a basis to attempt to eliminate reflections of beam $I_0$ on the bottom of the cell, is only a theoretical value which in no way corresponds to a sudden beam cutoff. In fact, it is impossible to obtain this type of clean cut, and a gradual attenuation of the light intensity is observed beyond the limits fixed by the aperture W. This is known under the name of Gaussian drag.

For various reasons related to size and ultrasound absorption, it is impossible to apply the beam I sufficiently high on the cell 101 entry face for this Gaussian drag to be reduced sufficiently to prevent its reflection on the lower face of the cell from disturbing the measurements. Under these conditions, there is actually a parasite reflection, or at least a diffusion, on this lower face. This generates a parasite beam $I_R$ which is not well delimited, and which passes through lens 205 to distribute a diffused signal on detector 206. This diffused signal obviously disturbs the measurements, which has the same effect as increasing the overall background noise.

An optic-acoustic modulator using the same interaction effect between the light wave and the ultrasonic wave has been described elsewhere in French patent 2 635 879 registered on Aug. 25, 1989 in the name of the Litton Systems company. However, the various parameters and particularly the interaction cell entry and exit angles, are selected such that the exit beam is colinear with the entry beam. In this system, obviously the frequency change of the emerging wave is used rather than its direction change which is deliberately made almost zero and invariable with the frequency. The choice of these parameters also implies that the electrical signal used to modulate the optical signal can never be wideband.

SUMMARY OF THE INVENTION

In order to overcome these disadvantages, the invention proposes an acousto-optical angular deflection device of the type containing a block of active acousto-optical material consisting of a lower face fitted with an electro-acoustic transducer designed to transmit a beam of ultrasonic waves within the material perpendicularly to this lower face, an entry face designed to receive an incident optical beam at an angle such that it is subject to an anisotropic type acousto-optical interaction inside the block with the ultrasonic beam under "tangential Bragg" phase match conditions, and an exit face designed to allow a first optical beam transposed into frequency to pass under the action of the interaction with the ultrasonic beam by presenting a small angle with the normal to the ultrasonic beam propagation direction, this angle depending on the variation of the frequency of this optical beam, and a second optical beam with the same characteristics as the incident beam and inclined with respect to the first beam, mainly distinguished in that the block entry face is inclined with respect to the ultrasonic beam propagation direction by an angle a such that an optical beam with entry perpendicular to the direction of propagation of the ultrasonic waves can be used, respecting the Bragg tangential conditions.

BRIEF DESCRIPTION OF THE DRAWINGS

Other special features and advantages of the invention are described clearly in the description below presented as a non-restrictive example, with reference to the accompanying figures wherein.

DETAILED DESCRIPTION OF THE PREFERRED EMBODIMENTS

The device according to the invention may be made in four different forms. Each of these configurations has a slightly different set of advantages, but all can eliminate practically all parasitic reflected light and make it possible to enlarge the optical aperture W.

Cells according to the invention are distinguished by the inclination of the angles of the optical beam entry and exit faces, which are selected such that the cell operates under Bragg tangential conditions while using an entry beam significantly normal to the direction of the ultrasonic wave beam and providing a useful beam at the exit (after being subjected to the effects of the acousto-optical interaction) slightly inclined with respect to the entry beam. In the rest of this text, the angles of these faces will be measured with respect to a direction parallel to the direction of the ultrasonic wave beam, and therefore perpendicular to direction of the incident optical beam, using the convention that the anticlockwise direction is described by a positive value.

Under these conditions, and depending on the direction of these two angles, the following four possibilities are obtained:

configuration 1: lower sliding and low frequency;
configuration 2: higher sliding and high frequency;
configuration 3: lower sliding and high frequency;
configuration 4: higher sliding and low frequency.

As mentioned above, the low frequency is related to the frequency of the electrical signal which generates the ultrasonic beam, and lower or higher sliding refers to the frequency change of the optical beam.

The preferred construction is lower sliding and low frequency, since this simultaneously enables maximum elimination of the parasite light and operation in low frequency. This encourages increasing the optical beam aperture, which is essentially limited by the absorption of acoustic waves which determines the useful interaction length between these waves and light waves.

Figure 3:
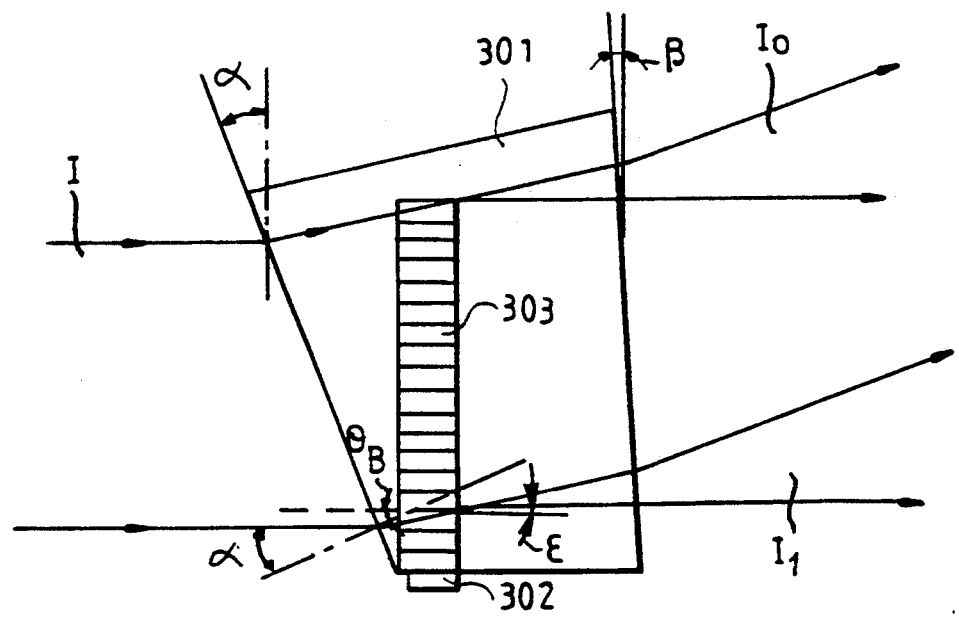
FIGS. 3 to 6 show Bragg cells according to four variants of the invention.

The preferred method of manufacture is shown in FIG. 3. The block of active material 301 contains an electro-acoustic transducer 302 fixed on its lower face, as close as possible to the edge between this lower face and the face through which the incident optical beam I enters. This entry face is inclined at a positive angle $\alpha$ which, based on elementary geometry rules, is the same as the inclination of the incident beam with respect to the normal to the entry face, this incident beam itself being parallel to the lower face containing transducer 302 and therefore perpendicular to the direction of propagation of the ultrasonic beam 303.

Due to refraction, this incident beam moves upwards on entry into block 301, at an angle $\Theta_B$ with respect to the lower face of the block. There is therefore no risk of it reaching this lower face, even if the Gaussian drag extends beyond the theoretical limits of this beam.

The beam, having thus penetrated into block 301, is subject to the interaction with ultrasounds 303 from transducer 302, and the part not assigned by this interaction crosses the block exit face, which is itself inclined by a positive angle $\beta$ significantly smaller than $\alpha$. Under these conditions, the unaffected emerging beam $I_0$ exits from this face and is significantly remote from the direction of the incident beam I.

The part of the beam which was subject to interaction leaves the interaction zone at a small and positive angle $\alpha$ with respect to the lower face of the block, and therefore to the direction of the incident beam I, as in previous inventions since Bragg tangential conditions were set up. This beam affected by the interaction finally leaves the block in the form of a beam $I_1$ parallel to the entry beam I when the frequency applied to transducer 302 is exactly the same as the frequency for Bragg tangential conditions. The refraction at the exit from this face cancels out $\epsilon$, taking account of $\beta$.

This device is configured starting from the angle $\Theta_B$ which is determined by known methods starting from optical and acousto-optical indices of the material used for block 301 in order to satisfy Bragg tangential conditions. When $\Theta_B$ and usable frequencies have been determined, the angle $\beta$ can be deduced using known methods.

Under these conditions, with $n_0$ and $n_e$ as ordinary and extraordinary optical indices of the material from which block 301 is made, angles $\alpha$ and $\beta$ are determined according to the invention by the following formulas:

$$\alpha = a\tan\left[\frac{\sin\theta_B}{\cos\theta_B - \frac{1}{n_0}}\right]$$

$$\beta = a\tan\left[\frac{\sin\epsilon}{\cos\epsilon - \frac{1}{n_e}}\right]$$

Figure 1:
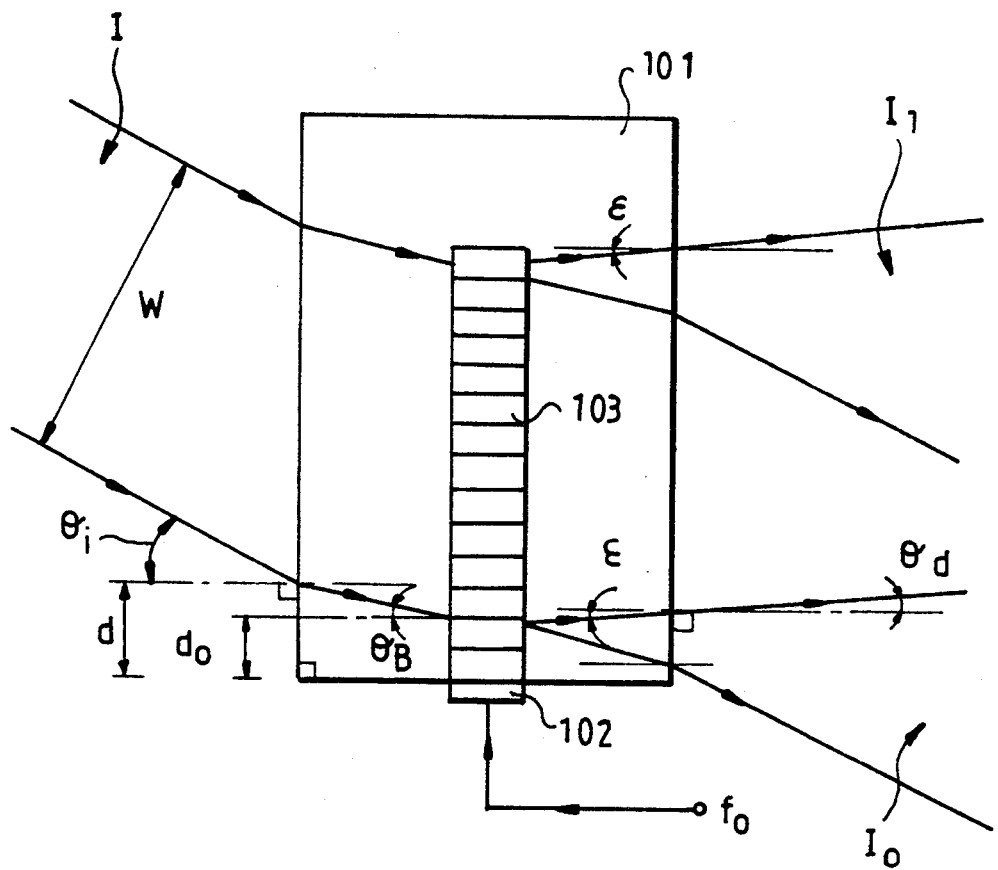
FIG. 1 shows a Bragg cell of a known type.
Figure 4:
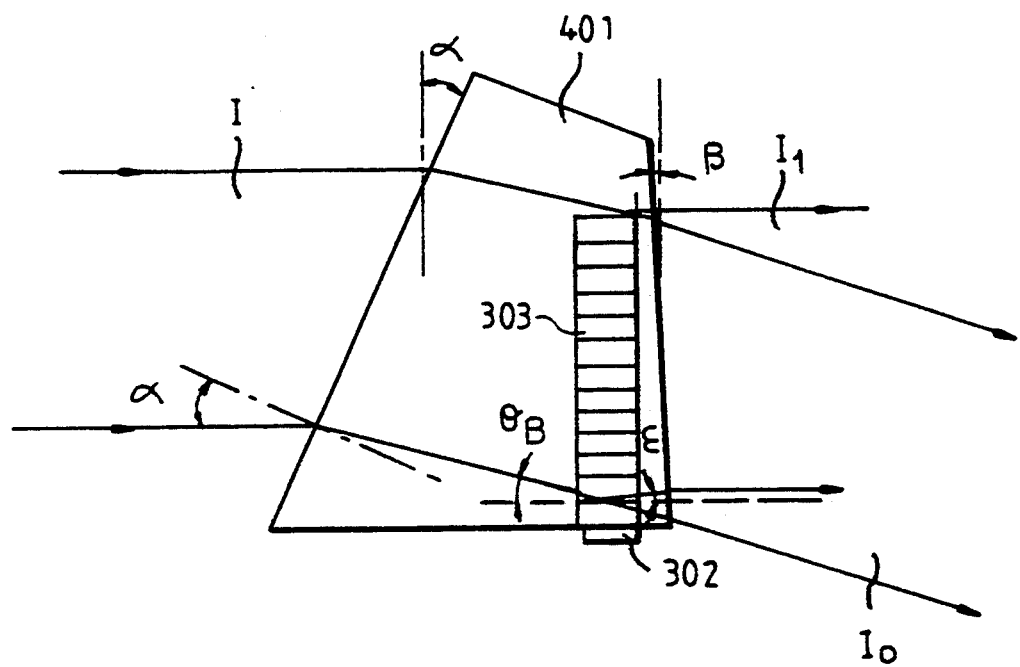

The second method of manufacture is shown in FIG. 4 and is of upper sliding and high frequency type. For this, the angle $\alpha$ is negative whereas the angle $\beta$ is positive. Under these conditions, it is found that the incident beam I, after refraction on the entry face, tends to move towards the bottom of block 301, in other words to approach the lower face of the block. However, the inclination is less than that using known systems shown in FIG. 1 but, in order to limit risks of reflection on this lower face, the electro-acoustic transducer 302 has been placed as close as possible to the block outlet face, such that the incident beam can be moved as far as possible from this lower face.

Figure 5:
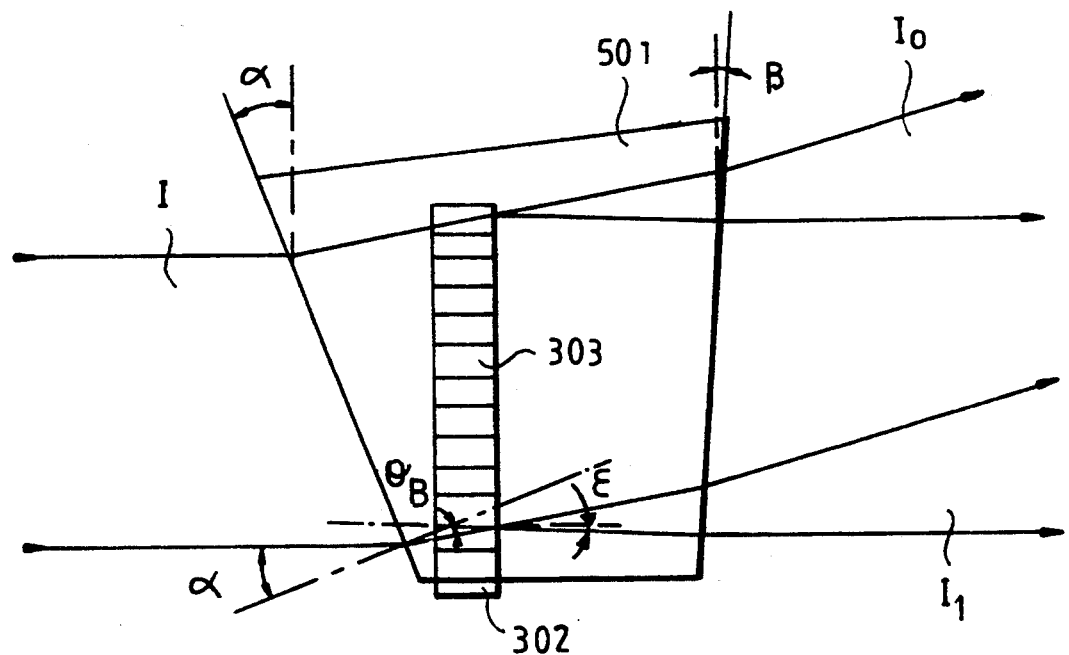

The third method of manufacture, lower sliding and high frequency type, is shown on FIG. 5. Externally, block 501 looks very much like the block used in the first method of manufacture in FIG. 3, with a positive angle $\alpha$, but the angle $\beta$ in this case is negative. The external similarity between the two construction methods is due to the fact that this angle $\beta$ is low and is not particularly significant.

Figure 6:
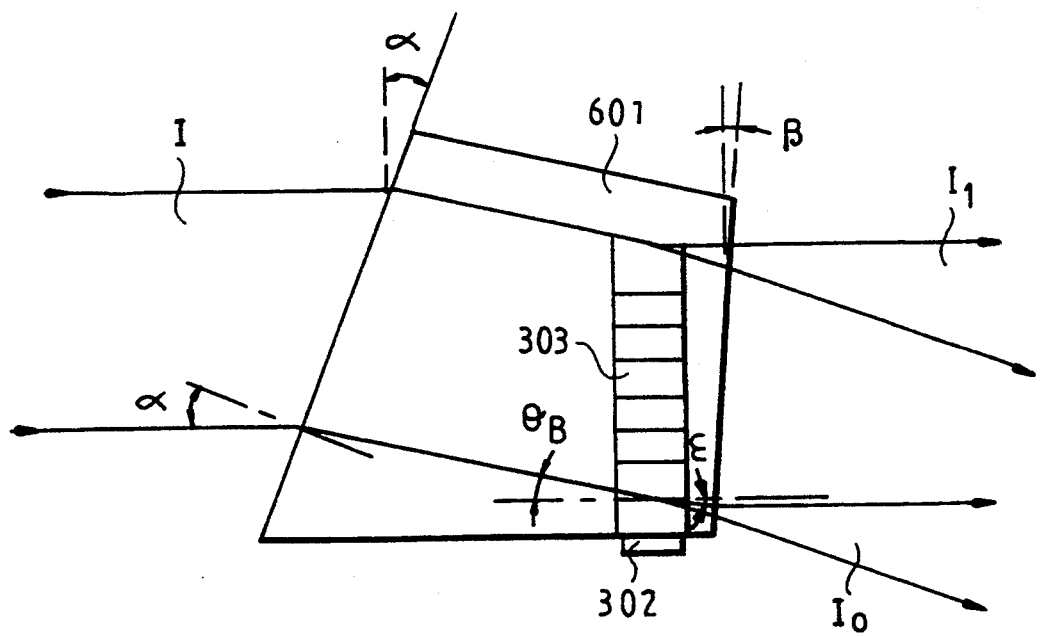

The fourth method of manufacture, upper sliding and low frequency type, is shown on FIG. 6. Externally it resembles the second method of manufacture in FIG. 4 with a negative angle, $\alpha$ but with a negative angle $\beta$.

The method of manufacture (or configuration) number one, in other words lower sliding and low frequency, is very good for making a spectrum analyzer. However, other methods of manufacture also have their advantages and as a practical construction example, we obtain the following results using an LiNbO$_3$ material and angles very close to 25° for $\alpha$ and 5° for $\beta$:

Configuration 1 (lower sliding and low frequency)
Advantages: high BT and high dynamics

| F$_{O(BF)}$: | 2.2 GHz |
|---|---|
| Frequency band: | 1 GHz |
| BT: | 2000 |
| Cell dynamics: | >70 dB.MHz |

Configuration 2 (upper sliding and high frequency)
Advantages: High passband

| F$_{O(BF)}$: | 2.8 GHz |
|---|---|
| Frequency band: | 2 GHz |
| BT: | 1000 |
| Cell dynamics: | 60 dB.MHz |

Configuration 3 (lower sliding and high frequency)
Advantages: High passband and high dynamics

| F$_{O(BF)}$: | 2.7 GHz |
|---|---|
| Frequency band: | 2 GHz |
| BT: | 1000 |
| Cell dynamics: | 70 dB.MHz |

Configuration 4 (higher sliding and low frequency)
Advantages: High dynamics

| F$_{O(BF)}$: | 2.2 GHz |
|---|---|
| Frequency band: | 1 GHz |
| BT: | 300 |
| Acousto-optical diffraction efficiency: | 40%/W$_{RF}$ |
| Cell dynamics: | >80 dB.MHz |

Figure 7:
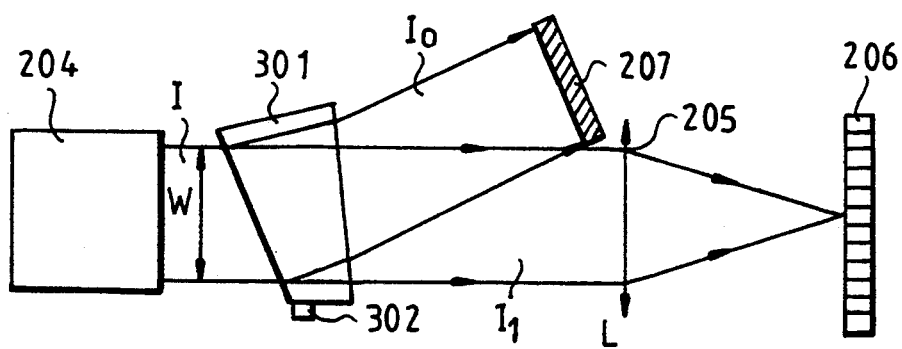
FIG. 7 shows a spectrum analyzer according to the invention.

Configuration 1, which shows a very good BT product and very high dynamics, and a complete absence of a parasite reflection, is particularly good for making a spectrum analyzer such as that shown in FIG. 7.

Figure 2:
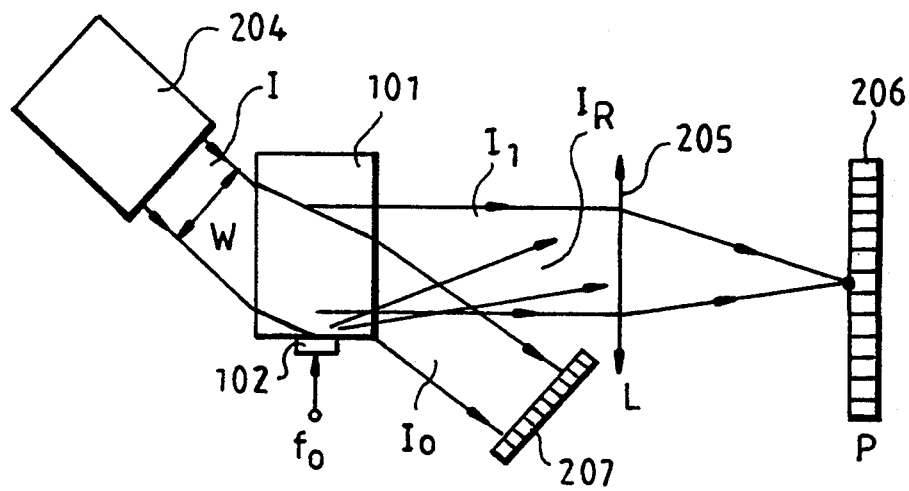
FIG. 2 shows a spectrum analyzer of a known type.

As can be seen in this figure, the sketch of this analyzer is very similar to that shown on FIG. 2, but with a cell 301 of the lower sliding and low frequency type. Under these conditions, the light source 204 is placed to emit an incident beam I which is parallel to the lower face of block 301 containing the ultrasonic transducer 302 and almost parallel to the emerging useful beam I$_0$. This beam also passes through a lens 205 which focuses it on a photodetector network 206. However, the emerging parasite beam I$_0$ is directed upwards, which clearly shows that there can be no parasite reflection on the lower face of block 301. This beam I$_0$ is absorbed by an absorber 207.

We claim:

1. Acousto-optical angular deflection device of the type consisting of a block (301) made of active acousto-optical material consisting of a lower face equipped with an electro-acoustic transducer (302) designed to transmit a beam of ultrasonic waves (303) in a material perpendicularly to this lower face, an entry face designed to receive an incident optical beam (I) at an angle such that it is subject to an anisotropic type of acousto-optical interaction inside the block with the ultrasonic beam under "Bragg tangential" phase matching conditions, and an exit face designed to allow a first optical beam (I$_1$) to pass, transposed in frequency under the action of the interaction with the ultrasonic beam by presenting a low angle with a normal to the direction of propagation of the ultrasonic beam, this angle depending on the frequency variation of this optical beam, and a second optical beam (I$_0$) with the same characteristics as the incident beam and inclined with respect to the first beam, wherein the block entry face (301) is inclined with respect to the direction of propagation of the ultrasonic beam by an angle $\alpha$ such that an optical entry beam (I) is perpendicular to the direction of propagation of the ultrasonic waves (303) while respecting Bragg tangential conditions.

2. Device according to claim 1, wherein the angle $\alpha$ is given by the formula:

$$\alpha = a\tan\left[\frac{\sin\theta_B}{\cos\theta_B - \frac{1}{n_0}}\right]$$

where $n_0$ is the ordinary optical index of the material used in the block (301) and $\Theta_B$ is the angle of incidence inside this block of the beam intended to be subjected to an interaction with the ultrasonic waves beam (303).

3. Device according to claim 1, wherein the exit face is inclined at an angle $\beta$ with respect to the direction of propagation of the ultrasonic wave beam (303) in order to correct the direction of the emerging beam having been subject to the interaction (I), when this interaction takes place at the average frequency ($F_0$) of these ultrasonic waves, in a direction parallel to the direction of the incident optical beam (I).

4. Device according to claim 3, wherein the angle $\beta$ is given by the formula:

$$\beta = atan\left[\frac{\sin \epsilon}{\cos \epsilon - \frac{1}{n_e}}\right]$$

where $n_e$ is the extraordinary optical index and $\epsilon$ the angle of the beam after being subjected to an interaction ($I_1$) at the exit from the interaction area (303) in the block (301).

5. Device according to either of claims 3 or 4, wherein angles $\alpha$ and $\beta$ are positive to obtain a sliding lower frequency and low frequency configuration.

6. Device according to either of claims 3 or 4 wherein the angle $\alpha$ is negative and the angle $\beta$ is positive to obtain a sliding higher frequency and high frequency configuration.

7. Device according to either of claims 3 or 4, wherein the angle $\alpha$ is positive and the angle $\beta$ is negative to obtain a sliding lower frequency and high frequency configuration.

8. Device according to either of claims 3 or 4, wherein angles $\alpha$ and $\beta$ are negative in order to obtain a sliding higher frequency and low frequency configuration.

9. Spectrum analyzer of a type including means (204) to emit a parallel monochromatic optical beam (I), a frequency transposition device (301) in order to receive this incident beam and transpose its frequency as a function of an electrical signal designed to excite an ultrasonic wave beam in this device and to emit a first emerging beam ($I_1$), the frequency of which is transposed and therefore its direction varies as a function of this transposition, and a second emerging beam ($I_0$) inclined with respect to the first and the frequency of which cannot be transposed, a lens (205) designed to focus this beam, and a network of photodetectors (206) designed to receive the focused beam, wherein the frequency transposition device (301) is a device according to claim 1.

10. Analyser according to claim 9, wherein it also includes means (207) for absorbing the second emerging optical beam ($I_0$).